United States Patent
Mine et al.

[11] Patent Number: 5,891,969
[45] Date of Patent: Apr. 6, 1999

[54] EPOXY RESIN AND EPOXY-FUNCTIONAL ORGANOPOLYSILOXANE

[75] Inventors: Katsutoshi Mine; Takae Takeuchi; Kimio Yamakawa, all of chiba Prefecture, Japan

[73] Assignee: Dow Corning Toray Silicone Co., Ltd., Tokyo, Japan

[21] Appl. No.: 795,919

[22] Filed: Feb. 5, 1997

[30] Foreign Application Priority Data

Feb. 7, 1996 [JP] Japan ................................. 8-045453

[51] Int. Cl.⁶ .......................... C08L 63/00; C08L 63/02; C08L 83/06
[52] U.S. Cl. ................................. 525/476; 528/34
[58] Field of Search ................................. 525/476; 528/34

[56] References Cited

U.S. PATENT DOCUMENTS

| | | | |
|---|---|---|---|
| 4,208,503 | 6/1980 | Martin | 528/14 |
| 4,851,481 | 7/1989 | Kuriyama et al. | 525/454 |
| 5,468,827 | 11/1995 | Morita | 528/15 |
| 5,486,588 | 1/1996 | Morita | 528/15 |
| 5,516,858 | 5/1996 | Morita et al. | 525/478 |

FOREIGN PATENT DOCUMENTS

| | | |
|---|---|---|
| 56-145942 | 11/1981 | Japan . |
| 62-138588 | 6/1987 | Japan . |
| 62-27095 | 6/1987 | Japan . |
| 62-192423 | 8/1987 | Japan . |
| 4-34908 | 2/1992 | Japan . |

*Primary Examiner*—Robert E. Sellers
*Attorney, Agent, or Firm*—Larry A. Milco

[57] ABSTRACT

A curable epoxy resin composition comprising (A) a curable epoxy resin and (B) an organopolysiloxane prepared by equilibrium polymerization and having the average unit formula $$(R^1SiO_{3/2})_a(R^2{}_2SiO_{2/2})_b(R^2{}_3SiO_{1/2})_c(R^3O_{1/2})_d$$

in which $R^1$ is an epoxy-functional monovalent organic group, $R^2$ is a monovalent hydrocarbon group, $R^3$ is a hydrogen atom or an alkyl group having no more than 4 carbon atoms, a>0, b>0, d>0 and c≧0. Also, an electronic component coated with a product obtained by curing the aforesaid composition

10 Claims, 2 Drawing Sheets

FIGURE I

EPOXY RESIN AND EPOXY-FUNCTIONAL ORGANOPOLYSILOXANE

BACKGROUND OF THE INVENTION

1. Field of the Invention

This invention relates to curable epoxy resin compositions and electronic components. More particularly, this invention relates to curable epoxy resin compositions that have excellent storage stability prior to cure, excellent initial and durable adhesiveness, and that are well-suited for use as a protectant for-electronic components. The invention also relates to highly reliable electronic components that are coated with the cured product from the curable epoxy resin composition.

2. Description of the Related Art

Curable epoxy resin compositions provide cured products that have excellent electrical properties, for example, volume resistivity, breakdown strength, dielectric constant, and so forth, and as a result are used as protectants and coatings for electronic components. However, since these cured products are generally stiff and have poor fleability, when coated on an electronic component, they cause large internal stresses to be applied to the electronic component. This can result in cracking in the cured material and/or in destruction of the electronic component To counter this, for example, Japanese Patent Publication Number Sho 62-27095 (1987) teaches a curable epoxy resin composition comprising the blend of curable epoxy resin and organopolysiloxane afforded by the hydrolysis and condensation of organosilane and bearing at least one epoxy-functional or amino-functional organic group and at least one hydroxyl group or hydrolyzable group, while Japanese Patent application Laid Open Number Sho 62-192423 (1987) teaches a curable epoxy resin composition comprising the blend of curable epoxy resin and epoxy-functional organopolysiloxane.

However, in the case of the curable epoxy resin composition proposed in Japanese Patent Publication Number Sho 62-27095, the final curable epoxy resin composition has a poor storage stability. The curable epoxy resin composition taught in Japanese Patent Application Laid Open Number Sho 62-192423 exhibits a poor initial and durable adhesiveness and thus performs poorly as a protectant for electronic components. Furthermore, these organopolysiloxanes are not compatible with curable epoxy resins, with the result that phase separation can occur during storage and the curable epoxy resin composition can suffer from a decline in transparency.

Moreover, electronic components coated with the cured products afforded by the aforementioned curable epoxy resin compositions suffer from the problem of poor reliability as manifested by a poor moisture resistance and heat resistance.

The inventors achieved the present invention as a result of extensive investigations into the problems described above.

In specific terms, an object of the present invention is to provide curable epoxy resin compositions that have excellent storage stability prior to cure, excellent initial and durable adhesiveness, and that are well-suited for use as protectants for electronic components. Another object of the present invention is to provide highly reliable electronic components that are coated with the cured product from the curable epoxy resin composition.

SUMMARY OF THE INVENTION

The present invention relates to curable epoxy resin compositions, comprising:

(A) 100 part by weight of a curable epoxy resin; and (B) 0.1 to 500 parts by weight of an organopolysiloxane prepared by equilibrium polymerization and having an average unit formula:

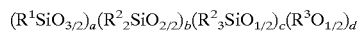

wherein $R^1$ is an epoxy-functional monovalent organic group, $R^2$ is a monovalent hydrocarbon group, $R^3$ is a hydrogen atom or an alkyl group having no more than 4 carbon atoms, a>0, b>0, d>0, and c≧0.

The present invention also relates to curable epoxy resin compositions, comprising (A) 100 part by weight of a curable epoxy resin;

(B) 0.1 to 500 parts by weight of an organopolysiloxane prepared by equilibrium polymerization and having an average unit formula:

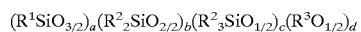

wherein $R^1$ is an epoxy-functional monovalent organic group, $R^2$ is a monovalent hydrocarbon group, $R^3$ is a hydrogen atom or an alkyl group having no more than 4 carbon atoms, a>0, b>0, d>0, and c≧0; and (C) 0.1 to 300 parts by weight of a phenyl-containing organopolysiloxane that is free of epoxy-functional monovalent organic groups and in which silicon-bonded phenyl makes up at least 10 mole % of the total silicon-bonded organic groups.

The present invention also relates to a method of protecting an electronic component by coating the electronic component with the composition of the present invention. The present invention also relates to electronic components so coated.

Figure 1:
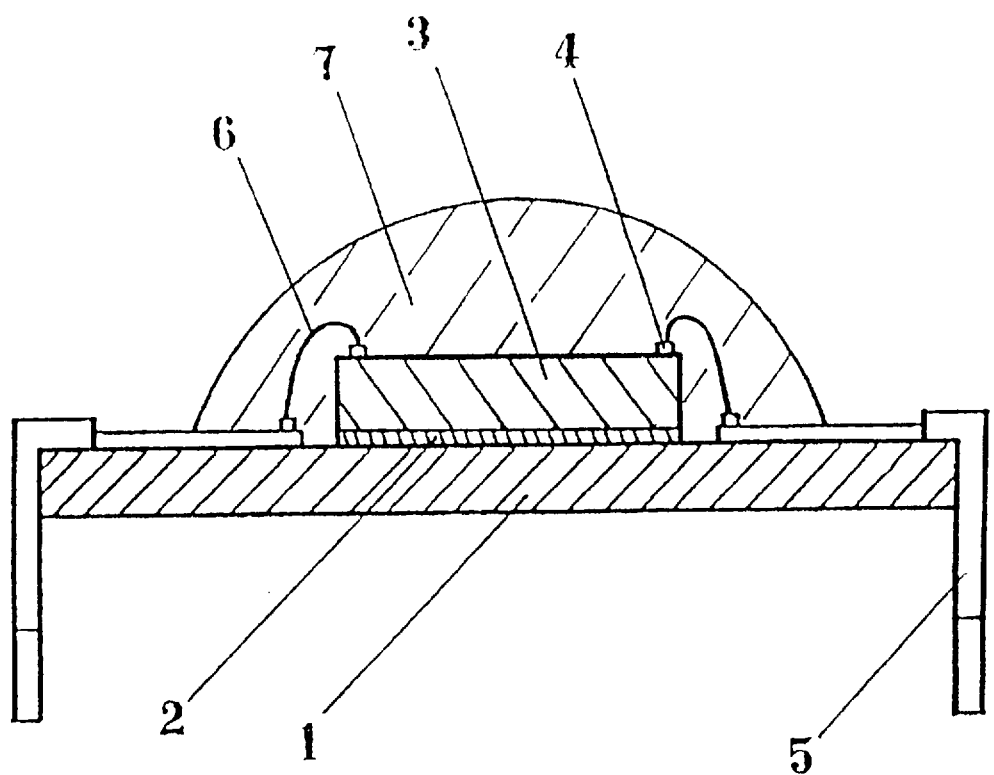
FIG. 1 contains the cross section of an electronic component according to the present invention.

REFERENCE NUMBERS 1 circuit board
2 adhesive
3 semiconductor element
4 bonding pad
5 lead frame
6 bonding wire
7 cured product from the curable epoxy resin composition
8 frame

DETAILED DESCRIPTION OF THE INVENTION

The curable epoxy resin composition according to the present invention will be explained in detail first.

The curable epoxy resin (A) is the base ingredient of the composition under consideration and is exemplified by, but not limited to, glycidyl ether epoxy resins such as bisphenol A epoxy resins, bisphenol F epoxy resins, phenol novolac epoxy resins, o-cresol novolac epoxy resins, and brominated epoxy resins; alicyclic epoxy resins; glycidyl ester epoxy resins; glycidylamine epoxy resins; and heterocyclic epoxy resins. The curing mechanisms for these curable epoxy resins are exemplified by thermosetting, ultraviolet curing, and moisture curing. Component (A) can be a liquid at room temperature or a solid whose softening point is at least room temperature, but component (A) is preferably a liquid at room temperature. A liquid component (A) provides a good handling liquid curable epoxy resin composition.

Other components that can be blended into the curable epoxy resin (A) are exemplified by, but not limited to, curing agents; cure accelerators; photosensitizers; fillers such as, for example, organic powders and inorganic powders; plasticizers; solvents such as, for example, xylene, toluene, or heptane; dyes; and unreactive epoxy resins. The cuing agents are exemplified by, but not limited to, organic acids such as, for example, carboxylic acids and sulfonic acids and by their anhydrides; organic hydroxy compounds such as, for example, phenol compounds, bisphenol compounds, and phenol novolac resins; halogen-containing organosilicon compounds; primary and secondary amino compounds; silanol-endblocked dimethylsiloxane oligomers; and silanol-endblocked dimethylsiloxane-methylvinylsiloxane oligomers. Combinations of two or more of these curing agents may be used. The cure accelerators are exemplified by, but not limited to, tertiary amine compounds; compounds of metals such as, for example, aluminum, and zirconium; organophosphorous compounds such as, for example, phosphine; heterocyclic amine compounds; boron complexes; organoaluminum compounds; organoaluminum chelate compounds; organoammonium salts; organosulfonium salts; and organoperoxides. The cure accelerator can be microcapsulated in order to inhibit the cure reaction at ambient temperature, or a cure retarder can be added. The filler is exemplified by, but not limited to, fibrous fillers such as, for example, glass fiber, asbestos, alumina fiber, ceramic fiber whose components are alumina and silica, boron fiber, zirconia fiber, silicon carbide fiber, metal fibers, phenolic fibers, aramid fibers, nylon fibers, polyester fibers, and natural animal and plant fibers; inorganic powders such as, for example, fused silica, precipitated silica, fumed silica, calcined silica, zinc oxide, calcined clay, carbon black, glass beads, alumina, talc, calcium carbonate, clay, aluminum hydroxide, barium sulfate, titanium dioxide, titanium oxide, aluminum nitride, silicon carbide, magnesium oxide, beryllium oxide, cerium oxide, kaolin, mica, zirconia, and metallic silicon; and organic powders of, for example, epoxy resin, nylon resin, phenolic resin, polyester resin, fluororesin, and silicone resin. These fillers may be used in combinations of 2 or more selections.

The organopolysiloxane (B) functions to provide the composition with excellent properties as a protectant for electronic components. It does this by imparting an excellent initial adhesiveness and a highly durable adhesiveness to the cured material afforded by the cure of the subject composition, and it accomplishes these functions without adversely affecting the storage stability of the composition. Component (B) also imparts flexibility and moisture resistance to the cured material. Component (B) is organopolysiloxane prepared by equilibrium polymerization and having the following average unit formula.

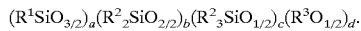

$R_1$ in the preceding formula is an epoxy-functional monovalent organic group. Each $R_1$ may be the same or may be a different epoxy-functional monovalent organic group. In preferred embodiments, $R^1$ is selected from the group consisting of glycidoxyalkyl groups, epoxycyclohexylalkyl groups and oxiranylakyl groups. The preferred glycioxyalkyl groups are 3-glycidoxypropyl, and 4-glycidoxybutyl. The preferred epoxycyclohexylalkyl groups are 2-(3,4-epoxycyclohexyl)ethyl, and 3-(3,4-epoxycyclohexyl) propyl. The preferred oxiranylalkyl groups are 4-oxiranylbutyl, and 8-oxiranyloctyl. Glycidoxyalkyl groups such as 3-glycidoxypropyl are particularly preferred.

$R^2$ in the preceding formula is a monovalent hydrocarbon group. Each $R^2$ may be the same or may be a different monovalent hydrocarbon group. In preferred embodiments $R^2$ is selected from tMe group consisting of allyl groups, alkenyl groups, aryl groups, aralyl groups and haloalkyl groups. The preferred alkyl groups are methyl, ethyl, propyl and butyl. The preferred alkenyl groups are vinyl, allyl, butenyl, pentenyl, and hexenyl. The preferred aryl groups are phenyl, tolyl, and xylyl. The preferred amikyl group are benzyl, and phenethyl. The preferred haloalkyl group is 3,3,3-trifluoropropyl. Methyl, vinyl, and phenyl are partirularly preferred.

$R^3$ in the preceding formula is a hydrogen atom or an allyl group having no more than 4 carbon atoms. In preferred embodiments $R^3$ is selected from a hydrogen atom and a methyl group. In more preferred embodiments $R^3$ is a methyl group The subscripts a, b, and d in the formula are in each case positive numbers, while c is zero or a positive number.

The organopolysiloxane (B) is prepared by equilibrium polymerization. Component (B) can be prepared, for example, by the equilibrium polymerization, in the presence of an acidic or basic polymetion catalyst, of (i) an epoxy-functional trialkoxysilane having the general formula $R^1Si(OR^4)_3$; with (ii) a diorganosiloxne selected from the group consisting of
   (a) cyclic aiorganosiloxanes having the general formula

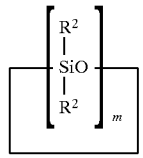

(b) straightchained diorganosiloxanes having the general formula

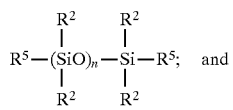

(c) mixtures of components (a) and (b); wherein $R^1$ and $R^2$ are as described above; $R^4$ is an alkyl group having up to 4 carbon atoms, each $R^5$ is independently selected from the group consisting of hydroxyl groups, alkoxy groups having up to 4 carbons, and $R^2$, with preferred alkoxy groups being methoxy, ethoxy, propoxy, and butoxy; m is an integer with a value of at least 3 and preferably is an integer with a value of at least 4 and particularly preferably is an integer with a value from 4 to 20; n is an integer with a value of at least one and preferably is an integer having a value from 1 to 50. In particularly preferred embodiments of the present invention, component (B) is prepared by the equilibrium polymerization method described above.

When component (B) is prepared by the above described equilibrium polymerization method, component (i) is preferably selected from the group consisting of 3-glycidoxypropyltrimethoxysilane, 2-(3,4-epoxycyclohexyl/ethyltrimethoxysilane, 4-oxiranylbutyltrimethoxysilane, and 8-oxiranyloctyltrimethoxysilane. 3-glycidoxypropyl/trimethoxysilane is particularly preferred.

Another method provided as an example of the preparation of component (B) is the equilibrium polymerization of epoxy-functional organopolysiloxane resin with the average unit formula ($R^1SiO_{3/2}$) with the diorganosiloxane (ii) in the presence of an acidic or basic polymerization catalyst wherein $R^1$ is as described above.

The first equilibrium polymerization method described above for the preparation of component (B) is executed by stirring, with heating or at room temperature, epoxy-functional alkoxysilane (i) with diorganosiloxane (ii) in the presence of an acidic or basic polymerization catalyst. The preferred acidic polymerization catalysts are mineral acids, carboxylic acids, and solid acid catalysts. The preferred mineral acids are hydrochloric acid, nitric acid, and sulfuric acid. The preferred carboxylic acids are acetic acid and propionic acid. The preferred solid acid catalyst is active clay. The preferred basic polymerization catalysts are alkali metal hydroxides, alkaline-earth metal hydroxides and alkali metal salts of siloxanes. The preferred alkali metal hydroxides are sodium hydroxide, potassium hydroxide and cerium hydroxide. The preferred alkaline-earth metal hydroxides are calcium hydroxide and magnesium hydroxide. This equilibrium polymerization is accelerated by heating, and the preferred heating temperature is in the range from 50° C. to 150° C. This equilibrium reaction is in general terminated by the addition of a neutralizing agent for the polymerization catalyst or, when the polymerization catalyst is a solid catalyst, by the removal of the catalyst from the reaction system. In the case of basic polymerization catalysts, carbonic acid or a chlorosilane can be used as the neutralizing agent, and the use of chlorosilane, e.g., dimethyldichlorosilane, trimethylchlorosilane, etc., is preferred.

Component (B) is added to the subject composition at 0.1 to 500 weight parts and particularly preferably at 0.5 to 150 weight parts, in each case per 100 weight parts component (A). The addition of component (B) at less than 0.1 weight part per 100 weight parts component (A) cannot provide the resulting composition with an excellent initial adhesiveness and a highly durable adhesiveness, which makes such a composition unsuitable for service as a protectant for electronic components. The composition has a diminished storage stability when component (B) is added in excess of 500 weight parts.

Component (C) is preferably added to the subject composition in order to induce additional improvements in the compatibility between components (A) and (B). Component (C) is a phenyl-containing organopolysiloxane that is free of epoxy-functional monovalent organic groups and in which silicon-bonded phenyl makes up at least 10 mole % of the total silicon-bonded organic groups. The molecular structure of component (C) may be straight-chain, partially branched straight-chain, branched-chain, or a cyclic structure with a straight-chain structure being preferred. The silicon-bonded organic groups in component (C) are preferably selected from the group consisting of phenyl groups and $R^5$, wherein $R^5$ is as described above. Silicon-bonded phenyl must constitute at least 10 mole % of all these silicon-bonded organic groups.

Component (C) is added to the subject composition at from 0.1 to 300 weight parts and preferably at from 5 to 100 weight parts, in each case per 100 weight parts component (A). The addition of component (C) at less than 0.1 weight part per 100 weight parts component (A) cannot induce a satisfactory improvement in the compatibility between components (A) and (B). When more than 300 weight parts is added, the cured material will have a substantially diminished mechanical strength and component (C) will bleed out from the cured material.

The curable epoxy resin composition according to the present invention is prepared by mixing components (A) and (B) and optionally component (C) to homogeneity. In a generally preferred embodiment, component (B) is preliminarily mixed with the epoxy resin corresponding to component (A) without curing agent and/or curing catalyst; this mixture and the curing agent and/or curing catalyst are stored as a two-part formulation; and these parts are mixed to homogeneity just before use. When a liquid curable epoxy resin is used as component (A), the resulting curable epoxy resin composition according to the present invention will be a liquid curable epoxy resin composition with an excellent pre-cure fluidity, which makes possible its use by such techniques as transfer molding, injection molding, potting, casting, dipping, application by dripping using, for example, a dispenser, spray coating, and painting. The viscosity of this liquid curable epoxy resin composition is not critical, and the viscosity can range, for example, from low viscosities (100 centipoise at 25° C.) to the high viscosities associated with a gum-like state. The cured product afforded by the cure of the curable epoxy resin composition according to the present invention has an excellent flexibility, adhesiveness, adhesion durability, and transparency and in consequence thereof can be used as a sealant resin, coating resin, immersion resin, adhesives, etc., for electrical and electronic components.

Electronic components according to the present invention will now be considered in detail. Electronic components according to the present invention are exemplified by electronic components comprising capacitors, resistors, or semiconductor elements such as ICs, hybrid ICs, LSIs, and so forth, but the type of electronic component is not critical. Electronic components according to the present invention will be explained in detail with reference to the appended drawings. In the example of an electronic component according to the present invention shown in FIG. 1, a semiconductor element 3 is mounted on a circuit board 1 via an interposed adhesive 2. This electrical component has a structure in which the bonding pads 4 on the top edge of the semiconductor element 3 are electrically connected to the lead frame 5 on the circuit board 1 by bonding wires 6 and the semiconductor element 3 is coated with the cured product 7 afforded by the above-described curable epoxy resin composition. When the curable epoxy resin composition is fluid, as demonstrated in FIG. 2 a frame 8 can be deployed on the circumference of the semiconductor element 3 in order to prevent outflow of the composition around the semiconductor element 3 when the curable epoxy resin composition is coated on the semiconductor element 3 on the circuit board 1.

The method for fabricating electronic components according to the present invention is not crucial. As an example, the electronic component can first be coated with the curable epoxy resin composition as described above and the composition can then be cured by the appropriate methodology, i.e., by heating when the composition is heat curable or by irradiation with ultraviolet light when the composition is UV curable. In the case of heat-curable epoxy resin compositions, the temperature for heating the composition is not critical as long as heating is not carried out to a temperature that will thermally degrade the electronic component. For example, temperatures of 50° C. to 250° C. are preferred and temperatures of 90° C. to 200° C. are particularly preferred. Moreover, electronic components according to the present invention can include an additional resin sealing with a curable organic sealant resin after the semiconductor element 3 has been coated with the cured product from the curable epoxy resin composition as in FIG. 1 or 2. Said curable organic sealant resins are exemplified by epoxy resins, polyimide resins, polyether resins, polyphenylene sulfide resins, and liquid-crystalline polymers.

EXAMPLES

The curable epoxy resin composition and electronic components according to the present invention will be explained further using working examples. The storage stability of the curable epoxy resin compositions, the initial adhesiveness and adhesion durability of their cured products, and the electronic component reliability were evaluated in the examples as described below. The values reported for the viscosity were measured at 25° C.

Storage stability of the curable epoxy resin compositions

In one test, the curing catalyst-free epoxy resin composition was heated under seal at 50° C. for 5 days and the viscosity of the composition was then measured using a rotational viscometer. In another test, the epoxy resin composition, in this case lacking both the curing agent and curing catalyst, was heated under seal at 50° C. for 30 days, after which the change in the transparency of the composition was measured on the basis of the light transmittance. In this case, a transmittance of 100% was assigned to the transmittance of pure water in a glass cell with an optical path length of 10 mm at a wavelength of 589 nm.

Initial adhesiveness of the cured product

The curable epoxy resin composition was coated on quartz glass sheet, aluminum sheet, and glass fiber-reinforced epoxy resin sheet and then cured by heating in a forced convection oven at 120° C. for 4 hours. The initial adhesiveness of the resulting cured product is reported on the following scale.

+: strong bonding x: partial debonding xx: complete debonding

Adhesion durability of the cured product

The curable epoxy resin composition was coated on quartz glass sheet aluminum sheet, and glass fiber-reinforced epoxy resin sheet and then cured by heating in a forced convection oven at 120° C. for 4 hours. The resulting cured product on the substrate was thereafter held in at 121° C./100% RH ambient for 24 hours. The adhesion durability of the cured product is reported on the following scale.

+: strong bonding x: partial debonding xx: complete debonding

Figure 2:
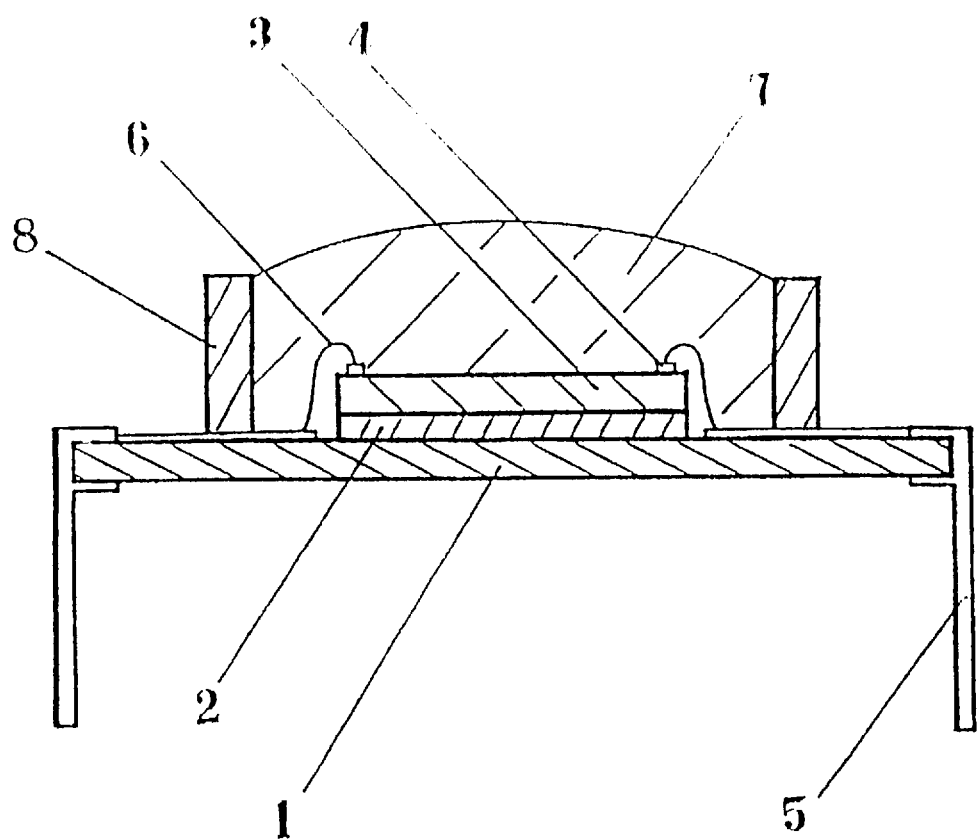
FIG. 2 contains the cross section of the electronic components used in the examples.

The electronic component reliability was measured using electronic components in accordance with FIG. 2. These electronic components were fabricated as follows. A semiconductor element 3 having an aluminum circuit pattern formed on its surface was mounted on an alumina ceramic circuit board 1 using an adhesive 2. The bonding pads 4 on the top edge of the semiconductor element 3 were then electrically connected to the lead frame 5 by gold bonding wires 6. The curable epoxy resin composition was thereafter applied onto the surface of the semiconductor element 3 using a dispenser. Since the curable epoxy resin composition was fluid, a rubber frame 8 with a height of 1 mm was preliminarily installed around the semiconductor element 3. The curable epoxy resin composition was cured by heating in a forced convection oven at 120° C. for 4 hours to yield an electronic component in which the semiconductor element 3 was coated with cured product 7. A total of 20 such electronic components were fabricated in this manner for each test. The electronic components were subjected to 100 or 1,000 cycles in a thermal cycle test (1 cycle=−30° C. for 30 minutes, +100° C. for 30 minutes), after which the number of electronic components with a defective performance was determined.

Reference Example 1

100 g of cyclic dimethylsiloxane with the formula

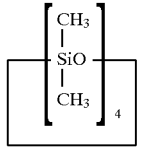

100 g of 3-glycidoxypropyltrimethoxysilane, and 0.05 g of potassium hydroxide were placed in a four-neck flask equipped with a stirrer, thermometer, and reflux condenser and an equilibrium polymerization was run by stirring at 120° C. for 3 hours. The reaction was terminated with dimethyldichlorosilane. The reaction mixture was distilled at 100° C. and 5 mmHg to remove the low boilers. Analysis of the resulting product by Fourier transform nuclear magnetic resonance analysis confirmed the product to be organopolysiloxane with the following average unit formula.

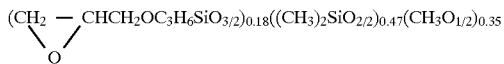

Reference Example 2

100 g of dimethylsiloxane oligomer with the average formula

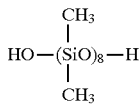

94 g of 3-glycidoxypropyltrimethoxysilane, and 0.14 g of potassium hydroxide were placed in a four-neck flask equipped with a stirrer, thermometer, and reflux condenser and an equilibrium polymerization was run by stirring at 120° C. for 3 hours. The reaction was terminated with dimethyldichlorosilane. The reaction mixture was distilled at 110° C. and 5 mmHg to remove the low boilers. Analysis of the resulting product by Fourier transform nuclear magnetic resonance analysis confirmed the product to be organopolysiloxane with the following average unit formula.

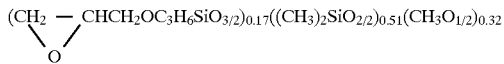

Reference Example 3

166.4 g of dimethylsiloxane oligomer with the average formula

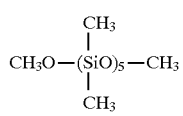

and 47.2 g of 3-glycidoxypropyltrimethoxysilane were placed in a four-neck flask equipped with a stirrer, thermometer, and reflux condenser. While heating at 60° C. and stirring, 7.2 g of water was added dropwise to the system and the hydrolysis and condensation reactions were brought to completion by reaction for 6 hours. The reaction mixture was then distilled at 60° C. and 10 mmHg in order to remove low boilers such as the methanol by-product. Analysis of the resulting product by Fourier transform nuclear magnetic resonance analysis confirmed the product to be organopolysiloxane with the following average unit formula.

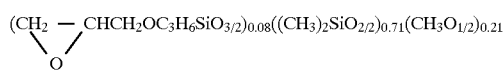

Example 1

An epoxy resin composition was prepared by mixing the following to homogeneity: 70 weight parts epoxy resin (viscosity=2,000 centipoise, epoxy equivalent weight=165) composed mainly of bisphenol F epoxy resin with the formula

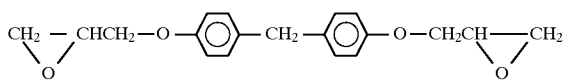

30 weight parts of the organopolysiloxane whose synthesis is described in Reference Example 1, and 100 weight parts tetraalkyltetrahydrophthalic-anhydride (molecular weight= 234) as curing agent. The storage stability of the composition was evaluated by heating the composition under seal for 5 days at 50° C. and then measuring its viscosity using a rotational viscometer. In addition, this composition was mixed to homogeneity with 1 weight part 1-isobutyl-2-methylimidazole (cure accelerator) to afford a curable epoxy resin composition whose cured product was evaluated for its initial adhesiveness, adhesion durability, and electronic component reliability. These results are reported in Table 1.

Example 2

A curable epoxy resin composition was prepared as in Example 1, but in this case using the organopolysiloxane whose synthesis is described in Reference Example 2 in place of the organopolysiloxane from Reference Example 1 that was used in Example 1. The cured product afforded by the cure of is curable epoxy resin composition was evaluated for its initial adhesiveness, adhesion durability, and electronic component reliability. These results are reported in Table 1.

Comparative Example 1

A curable epoxy resin composition was prepared as in Example 1, but in this case omitting the organopolysiloxane from Reference Example 1 that was used in Example 1. The cured product afforded by the cure of this curable epoxy resin composition was evaluated for its initial adhesiveness, adhesion durability, and electronic component reliability. These results are reported in Table 1.

Comparative Example 2

A curable epoxy resin composition was prepared as in Example 1, but in this case using the organopolysiloxane whose synthesis is described in Reference Example 3 in place of the organopolysiloxane from Reference Example 1 that was used in Example 1. The cured product afforded by the cure of this curable epoxy resin composition was evaluated for its initial adhesiveness, adhesion durability, and electronic component reliability. These results are reported in Table 1.

Comparative Example 3

A curable epoxy resin composition was prepared as in Example 1, but in this case replacing the organopolysiloxane from Reference Example 1 that was used in Example 1 with organopolysiloxane prepared by the addition reaction between trimethylsiloxy-endblocked dimethylsiloxane-methylhydrogensiloxane copolymer and allyl glycidyl ether. This organopolysiloxane had the following average formula.

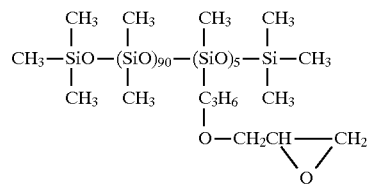

The cured product afforded by the cure of this curable epoxy resin composition was evaluated for its initial adhesiveness, adhesion durability, and electronic component reliability. These results are reported in Table 1.

Comparative Example 4

A curable epoxy resin composition was prepared as in Example 1, but in this case replacing the organopolysiloxane from Reference Example 1 that was used in Example 1 with organopolysiloxane prepared by the addition reaction between timethylsiloxy-endblocked dimethylsiloxane-methylhydrogensiloxane copolymer, allyl glycidyl ether, and vinyltrimethoxysilane. This organopolysiloxane had the following average formula.

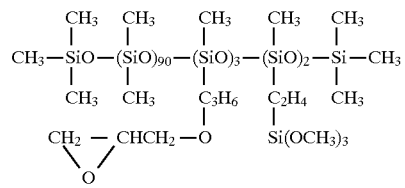

The cured product afforded by the cure of this curable epoxy resin composition was evaluated for its initial adhesiveness, adhesion durability, and electronic component reliability. These results are reported in Table 1.

Example 3

The following were mixed to homogeneity to give an epoxy resin composition: 38.2 weight parts epoxy resin (epoxy equivalent weight=165) composed mainly of bisphenol F epoxy resin, as descend in Example 1; 22.9 weight parts organopolysiloxane whose synthesis is described in Reference Example 1; and 15.3 weight parts silanol-endblocked dimethylsiloxane-methylphenylsiloxane copolymer oligomer having a viscosity of 500 centipoise and 44 mole % phenyl based on the total of the methyl and phenyl groups. The storage stability of the composition was evaluated by heating it under seal at 50° C. for 30 days and measuring the change in composition transparency using the transmittance.

This composition was then mixed to homogeneity with 61.0 weight parts tetraalkyltetrahydrophthalic anhydride (molecular weight=234) as curing agent and 0.8 weight part 1-isobutyl-2-methylimidazole as cure accelerator to give a curable epoxy resin composition whose cured product was evaluated for its initial adhesiveness, adhesion durability, and electronic component reliability. These results are reported in Table 2.

Example 4

A curable epoxy resin composition was prepared as in Example 3, but in this case using the organopolysiloxane described in Reference Example 2 in place of the organopolysiloxane described in Reference Example 1 that was used in Example 3. The cured product afforded by the cure of this curable epoxy resin composition was evaluated for its initial adhesiveness, adhesion durability, and electronic component reliability. These results are reported in Table 2.

Comparative Example 5

A curable epoxy resin composition was prepared as in Example 3, but in this case omitting the organopolysiloxane from Reference Example 1 that was used in Example 3. The cured product afforded by the cure of this curable epoxy resin composition was evaluated for its initial adhesiveness, adhesion durability, and electronic component reliability. These results are reported in Table 2.

Comparative Example 6

A curable epoxy resin composition was prepared as in Example 3, but in this case using the organopolysiloxane described in Reference Example 3 in place of the organopolysiloxane from Reference Example 1 that was used in Example 3. The cured product afforded by the cure of this curable epoxy resin composition was evaluated for its initial adhesiveness, adhesion durability, and electronic component reliability. These results are reported in Table 2.

The curable epoxy resin composition according to the present invention is characterized by an excellent pre-cure storage stability, by an excellent initial adhesiveness and adhesion is durability, and by excellent qualities as a protectant for electronic components. In addition, electronic components according to the present invention are highly reliable because they are coated with the cured product afforded by the subject curable epoxy resin composition.

TABLE 1

|  | present invention | | comparative examples | | | |
|---|---|---|---|---|---|---|
|  | Ex. 1 | Ex. 2 | Comp. Ex. 1 | Comp. Ex. 2 | Comp. Ex. 3 | Comp. Ex. 4 |
| epoxy resin composition | | | | | | |
| viscosity (centipoise) | | | | | | |
| initial | 280 | 290 | 460 | 295 | 350 | 340 |
| 50° C./5 days | 290 | 300 | 470 | 420 | 360 | 345 |

TABLE 1-continued

|  | present invention | | comparative examples | | | |
|---|---|---|---|---|---|---|
|  | Ex. 1 | Ex. 2 | Comp. Ex. 1 | Comp. Ex. 2 | Comp. Ex. 3 | Comp. Ex. 4 |
| cured product | | | | | | |
| durometer (Shore D) | 78 | 79 | 95 | 77 | 72 | 72 |
| initial adhesiveness | | | | | | |
| QGS | + | + | + | + | + | + |
| AS | + | + | + | + | x | x |
| GFRERS | + | + | + | + | + | + |
| adhesion durability | | | | | | |
| QGS | + | + | + | + | x | x |
| AS | + | + | + | + | x | x |
| GFRERS | + | + | + | + | + | + |
| electronic component reliability (number of defects) | | | | | | |
| after 100 cycles | 0 | 0 | 20 | 0 | 2 | 2 |
| after 1,000 cycles | 0 | 0 | 20 | 3 | 6 | 6 |

Abbreviations used in Table 1.
QGS = quartz glass sheet
AS = aluminum sheet
GFRERS = glass fiber-reinforced epoxy resin sheet

TABLE 2

|  | present invention | | comparative examples | |
|---|---|---|---|---|
|  | Ex. 3 | Ex. 4 | Comp. Ex. 5 | Comp. Ex. 6 |
| epoxy resin composition | | | | |
| transmittance (%) | | | | |
| initial | 100 | 100 | 100 | 100 |
| 50° C./30 days | 100 | 100 | 100 | 94 |
| cured product | | | | |
| durometer (Shore D) | 69 | 70 | 78 | 68 |
| electronic component reliability (number of defects) | | | | |
| after 100 cycles | 0 | 0 | 12 | 0 |
| after 1,000 cycles | 0 | 0 | 20 | 3 |

We claim:

1. A curable epoxy resin composition, comprising:
   (A) 100 part by weight of a curable epoxy resin; and
   (B) 0.1 to 500 parts by weight of an organopolysiloxane prepared by equilibrium polymerization and having an average unit formula:

$(R^1SiO_{3/2})_a(R^2{}_2SiO_{2/2})_b(R^3{}_3SiO_{1/2})_c(R^3O_{1/2})_d$ wherein $R^1$ is an epoxy-functional monovalent organic group, $R^2$ is a monovalent hydrocarbon group, $R^3$ is a hydrogen atom or an alkyl group having no more than 4 carbon atoms, a>0, b>0, d>0, and c≧0.

2. The curable epoxy resin composition of claim 1 wherein component (B) is prepared by an equilibrium polymerization, in the presence of an acidic or basic polymerization catalyst, of
   (i) an epoxy-functional trialkoxysilane having the general formula $R^1Si(OR^4)_3$ wherein $R^1$ an epoxy-functional monovalent organic group and, $R^4$ is an alkyl group having no more than 4 carbon atoms; with (ii) a diorganosiloxane selected from the group consisting of (a) cyclic diorganosiloxanes having Me general formula

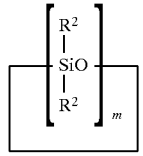

wherein $R^2$ is a monovalent hydrocarbon group and m is an integer having a value of at least 3;

(b) straight-chained diorganosiloxanes having the general formula

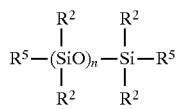

wherein $R^2$ is a monovalent hydrocarbon group, each $R^5$ is independently selected from the group consisting of hydroxyl groups, alkoxy groups having no more than 4 carbon atoms, and monovalent hydrocarbon groups, and n is an integer with a value of at least 1; and (c) mixtures of components (a) and (b).

3. The curable epoxy resin composition of claim 2 further comprising:

(C) 0.1 to 300 parts by weight of a phenyl-containing organopolysiloxane that is free of epoxy-functional monovalent organic groups and in which silicon-bonded phenyl makes up at least 10 mole % of the total silicon-bonded organic groups.

4. The curable epoxy resin composition of claim 1 further comprising:

(C) 0.1 to 300 parts by weight of a phenyl-containing organopolysiloxane that is free of epoxy-functional monovalent organic groups and in which silicon-bonded phenyl makes up at least 10 mole % of the total silicon-bonded organic groups.

5. The curable epoxy resin composition according to claim 1 wherein said composition is a liquid.

6. The curable epoxy resin composition according to claim 2 wherein said composition is a liquid.

7. The curable epoxy resin composition according to claim 3 wherein said composition is a liquid.

8. The curable epoxy resin composition according to claim 4 wherein said composition is a liquid.

9. The product obtained from incipient materials:

(A) 100 part by weight of a curable epoxy resin; and (B) 0.1 to 500 parts by weight of an organopolysiloxane prepared by equilibrium polymerization and having an average unit formula:

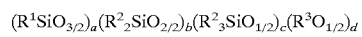

wherein $R^1$ is an epoxy-functional monovalent organic group, $R^2$ is a monovalent hydrocarbon group, $R^3$ is a hydrogen atom or an alkyl group having no more than 4 carbon atoms, a>0, b>0, d>0, and c≧0.

10. The product obtained from incipient materials:

(A) 100 part by weight of a curable epoxy resin;

(B) 0.1 to 500 parts by weight of an organopolysiloxane prepared by equilibrium polymerization and having an average unit formula:

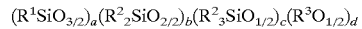

wherein $R^1$ is an epoxy-functional monovalent organic group, $R^2$ is a monovalent hydrocarbon group, $R^3$ is a hydrogen atom or an alkyl group having no more than 4 carbon atoms, a>0, b>0, d>0, and c≧0; and (C) 0.1 to 300 parts by weight of a phenyl-containing organopolysiloxane that is free of epoxy-functional monovalent organic groups and in which silicon-bonded phenyl makes up at least 10 mole % of the total silicon-bonded organic groups.

* * * * *